United States Patent
Jin

(10) Patent No.: US 11,848,196 B2
(45) Date of Patent: Dec. 19, 2023

(54) LIGHT-EMITTING DIODE PACKAGE HAVING CONTROLLED BEAM ANGLE AND LIGHT-EMITTING DEVICE USING SAME

(71) Applicant: Jea Un Jin, Iksan-si (KR)

(72) Inventor: Jea Un Jin, Iksan-si (KR)

(*) Notice: Subject to any disclaimer, the term of this patent is extended or adjusted under 35 U.S.C. 154(b) by 496 days.

(21) Appl. No.: 17/287,391

(22) PCT Filed: Jul. 31, 2019

(86) PCT No.: PCT/KR2019/009549
§ 371 (c)(1),
(2) Date: Apr. 21, 2021

(87) PCT Pub. No.: WO2020/166772
PCT Pub. Date: Aug. 20, 2020

(65) Prior Publication Data
US 2021/0399182 A1 Dec. 23, 2021

(30) Foreign Application Priority Data
Feb. 11, 2019 (KR) .................. 10-2019-0015545

(51) Int. Cl.
*H01L 33/60* (2010.01)
*H01L 25/075* (2006.01)
*H01L 33/52* (2010.01)
*H01L 33/48* (2010.01)

(52) U.S. Cl.
CPC .......... *H01L 33/60* (2013.01); *H01L 25/0753* (2013.01); *H01L 33/486* (2013.01); *H01L 33/52* (2013.01)

(58) Field of Classification Search
CPC ... H01L 33/60; H01L 25/0753; H01L 33/486; H01L 33/52
See application file for complete search history.

(56) References Cited

U.S. PATENT DOCUMENTS

| 9,564,556 B2* | 2/2017 | Kong | ...................... H01L 33/32 |
| 2014/0070259 A1* | 3/2014 | Yoon | ...................... H01L 33/486 |
| | | | 257/99 |
| 2015/0076541 A1* | 3/2015 | Ikeda | ...................... H01L 33/50 |
| | | | 257/98 |

FOREIGN PATENT DOCUMENTS

| JP | 2005-203748 A | 7/2005 |
| JP | 2005-285874 A | 10/2005 |
| KR | 10-2003-0017907 A | 3/2003 |
| KR | 10-2008-0062259 A | 7/2008 |
| KR | 10-2013-0005793 A | 1/2013 |

* cited by examiner

*Primary Examiner* — David Vu
*Assistant Examiner* — Brandon C Fox
(74) *Attorney, Agent, or Firm* — NKL Law; Jae Youn Kim

(57) ABSTRACT

A light-emitting diode package having a controlled beam angle is proposed. The diode package can include at least one first lead frame; at least one second lead frame formed to correspond to and be spaced apart from the at least one first lead frame; light-emitting diode chips mounted on the at least one first lead frame; a first package main body which is fixed on the partial surfaces of the at least one first lead frame and the at least one second lead frame and formed so as to have a first inclined side at a portion of the circumference around the light-emitting diode chips; and a second package main body formed so as to have a second inclined side at the remaining portion of the circumference around the light-emitting diode chips other than the portion.

7 Claims, 4 Drawing Sheets

LIGHT-EMITTING DIODE PACKAGE HAVING CONTROLLED BEAM ANGLE AND LIGHT-EMITTING DEVICE USING SAME

TECHNICAL FIELD

The present disclosure relates to a light-emitting diode package having a controlled beam angle and a light-emitting device using the same. More particularly, the present disclosure relates to a light-emitting diode package having a controlled beam angle and a light-emitting device using the same, wherein the light-emitting diode package includes: light-emitting diode chips mounted on a first lead frame; a first package main body which is fixed on partial surfaces of the first lead frame and a second lead frame configured to be spaced apart from the first lead frame so as to have a first inclined side at a portion of the circumference around the light-emitting diode chips; and a second package main body configured to have a second inclined side at a remaining portion of the circumference around the light-emitting diode chips other than the portion, wherein the shortest distance between the second inclined side of the second package main body and the light-emitting diode chips is configured to be smaller than the shortest distance between the first inclined side and the light-emitting diode chips, thereby controlling a beam angle emitted from the light-emitting diode chips.

With using the light-emitting diode, the beam angle is controlled without the inclusion of a separate lens, and thus there are various advantageous such as an increase in luminance due to optical loss control, a reduction in power consumption and manufacturing costs, and a reduction in photo pollution.

BACKGROUND ART

A light-emitting diode (LED) is a solid state LED converting electrical energy to light energy. In general, such an LED includes at least one semiconductor material active layer sandwiched between semiconductor layers clad with opposite p- and n-type impurities. When bias is applied across the semiconductor layers clad with impurities, electrons and holes enter the active layer and recombine to generate light.

In general, a LED package having a package shape in which LED chips like light-emitting diodes are mounted on a base corresponding to a substrate or a lead frame and a dome-shaped lens, etc. covers upper portions of the LED chips is used. Whereby, the LED chips are protected from external pollutants or impacts and light extraction efficiency may be improved by minimizing total reflection of light by the lens.

However, as shown in FIG. 1, light generated from the LED chips is emitted to the entire area of the LED chips, so that there is a problem that a beam angle of the LED package is excessively wide, and as the LED package has the excessively wide beam angle, a lens part may be added in order to control the beam angle. However, in this case, a diameter of the lens is inevitably large so that the emitted light may enter the lens. Therefore, the size the LED package including the lens increases and the size of entire module including the LED package increases, thereby causing a problem of increased manufacturing costs.

As an alternative to the problem, a method that the light generated from the LED chips is reflected to an upper portion of the LED package to reduce the beam angle is used. In detail, a housing including a reflection side around the LED chips is used. However, light absorption due to the housing may be caused, so a material having high reflectivity is arranged on the reflection side of the housing in order to prevent the problem, so that the manufacturing costs may be increased. An interface between the housing and the lens is extended to the LED chips, so that the external pollutants such as moisture may pass through the LED chips, thereby reducing reliability of the LED package.

Meanwhile, the LED package capable of converting electric energy to light energy may be used in various light-emitting device, such as LED lights, display devices, etc. Among the devices, the display devices may consist of semiconductor LEDs including red (R), green (G), blue (B). Intervals between the semiconductor LEDs determines resolution of a display device, and in order to constitute the high resolution display device, a surface mountable type LED package in which individual LEDs are densely arranged is used.

Currently, the surface mountable type LED package used in the display devices is optimized for an indoor type, so that the LED chips are arranged considering a left and right beam angle rather than a top and bottom beam angle. When the surface mountable type LED package is used in outdoor display devices, a problem that light loss toward an upper portion of the display device occurs.

Accordingly, a LED package capable of controlling a beam angle in a specific direction without the inclusion of a separate lens and a LED device such as a display device using the same are required.

DISCLOSURE

Technical Problem

Accordingly, the present disclosure has been made keeping in mind the above-described necessities, and the present disclosure is intended to control a beam angle of emitted light beams, by arranging a package main body to be close to light-emitting diode chips without the inclusion of a separate lens and reflecting the light beams emitted toward an inclined side of the package main body, among light beams emitted from the light-emitting diode chips.

A further objective of the present disclosure is intended to increase reliability of the light-emitting diode package by spacing an envelope material configured to envelope the light-emitting diode chips from the package main body at a predetermined distance to control luminance unevenness caused by a surface tension of the envelope material.

Technical Solution

In order to accomplish the above objective, the present disclosure provides a light-emitting diode package having a controlled beam angle, the light-emitting diode package including: at least one first lead frame 102; at least one second lead frame 106 configured to correspond to and be spaced apart from the first lead frame; light-emitting diode chips 120 mounted on the first lead frame; a first package main body 130 which may be fixed on partial surfaces of the first lead frame and the second lead frame and configured to have a first inclined side 135 at a portion of circumference around the light-emitting diode chips; and a second package main body 140 configured to have a second inclined side 145 at a remaining portion of the circumference around the light-emitting diode chips 120 other than the portion having the first inclined side, wherein a shortest distance between the second inclined side 145 of the second package main body 140 and the light-emitting diode chips 120 may be smaller than a shortest distance between the first inclined side 135 and the light-emitting diode chips, and among light beams emitted from the light-emitting diode chips, light beams emitted towards the second inclined side 145 may be reflected such that an emission angle of the emitted light beams is controlled.

Herein, the second package main body 140 may have a spacing distance (d) spaced apart at a predetermined distance from an envelope material 110 configured to envelope the light-emitting diode chips, and the spacing distance (d) may be higher than or equal to 0.05 mm.

On the basis of a normal direction of the light-emitting diode chips, a height of an upper surface of the second package main body 140 may be equal to or higher than a height of an upper surface of the first package main body, the second inclined side 145 may be configured to be perpendicular to a mounting surface of the light-emitting diode chips 120, the second inclined side 145 may have a reflection film so as to reflect the light beams emitted from the light-emitting diode chips.

Moreover, the present disclosure provides a light-emitting device, such as a display device, which is configured to control a beam angle by using the light-emitting diode package having a controlled beam angle.

Advantageous Effects

According to the present disclosure, the light-emitting diode package having a controlled beam angle can control a beam angle in a specific direction without the inclusion of a separate lens, so that manufacturing costs can be reduced.

When the light-emitting diode package having a controlling beam angle and the light-emitting device using the same are used, luminance can be increased due to control of optical loss, power consumption can be reduced, and photo pollution can be reduced.

A gap between the envelope material and the second inclined side of the second package main body is configured to form a predetermined distance that can prevent a problem of luminance unevenness caused by a surface tension during formation of the envelope material, so that liability of the light-emitting diode package can be increased.

BEST MODE

Figure 1:
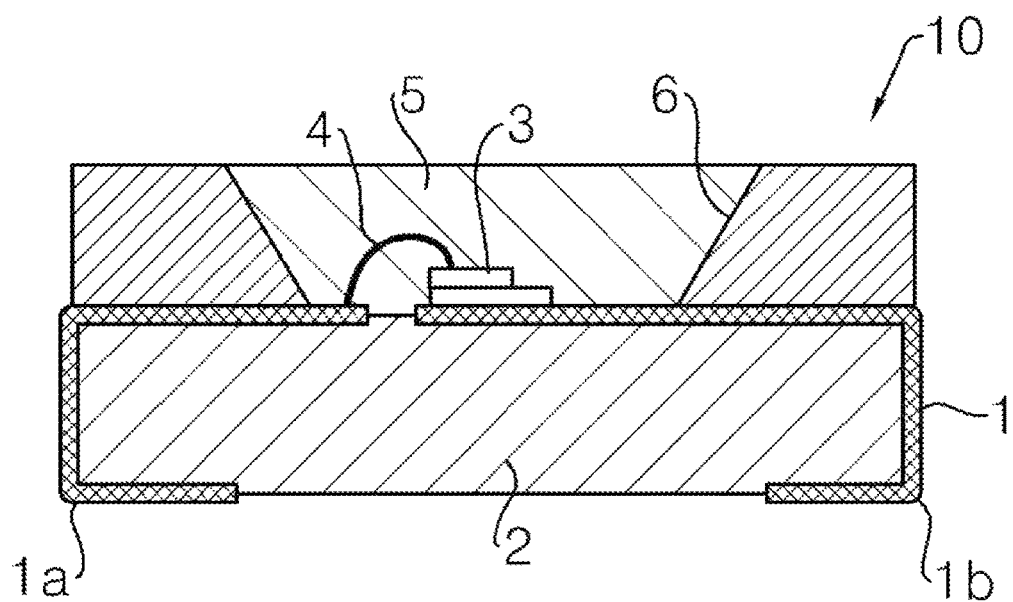
FIG. 1 is a sectional view showing a surface mountable type light-emitting diode package according to the related art.

Hereinbelow, exemplary embodiments of the present disclosure will be described in detail with reference to the accompanying drawings. The exemplary embodiments of the present disclosure may be variously modified and may have various shapes, and it should be understood that the exemplary embodiments of the present disclosure are not limited to the embodiments which will be described hereinbelow. The embodiments of the present disclosure are provided for allowing those skilled in the art to more clearly comprehend the present disclosure. Therefore, the shape and detailed structure of the elements shown in the drawings may be simplified for description. Terms used in the specification are used to describe the exemplary embodiments of the present disclosure.

Furthermore, when the present disclosure is described with reference to the accompanying drawings, the same reference numerals will be used to refer to the same elements and reduplicated descriptions therefor are omitted. Furthermore, when the present disclosure is described, when the functions of conventional elements and the detailed description of elements related with the present disclosure may make the gist of the present disclosure unclear, a detailed description of those elements will be omitted.

Figure 2A:
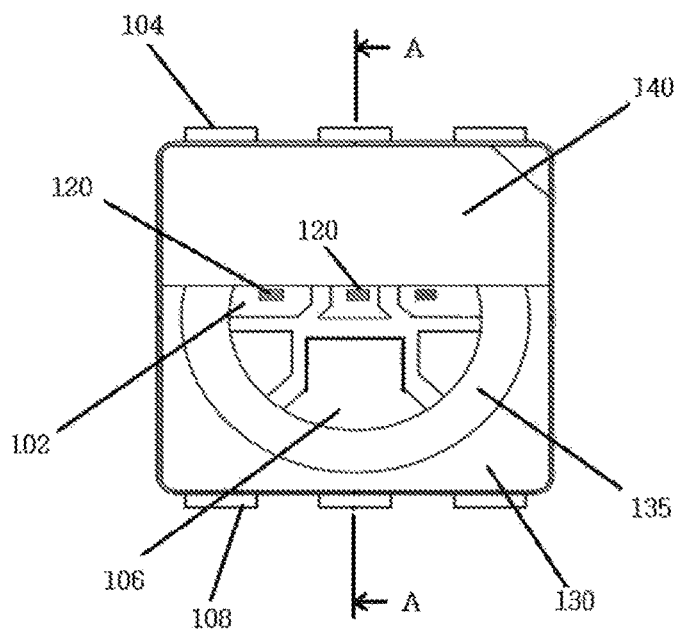
FIGS. 2A and 2B are a front view and a sectional view showing a surface mountable type light-emitting diode package having a controlled beam angle according to an embodiment of the present disclosure.
Figure 2B:
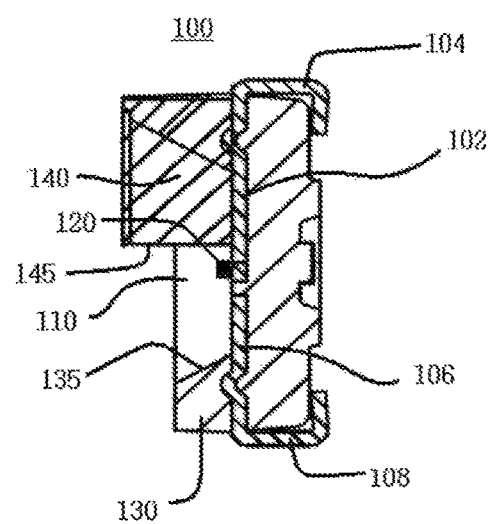

FIGS. 2A and 2B are a front view and a sectional view showing a surface mountable type light-emitting diode package (LED package) having a controlled beam angle according to an exemplary embodiment of the present disclosure. The sectional view shown in FIG. 2B shows a section taken along line A-A in the front view of FIG. 2A.

Referring to the front view and the sectional view shown in accompanying FIGS. 2A and 2B, as the exemplary embodiment of the present disclosure, the surface mountable type LED package 100 having the controlled beam angle includes: a first lead frame 102 which is a mounting space in the package and to which light-emitting diode chips (LED chips) 120 consisting of three LED chips of red (R), green (G), and blue (B) are mounted; three first lead terminals 104 extended from the first lead frame 102 and exposed to the outside of the package; three second lead frames 106 corresponding to the first lead frame 102 and exposed to the mounting space in the package; and three second lead terminals 108 extended from the second lead frames 106 and exposed to the outside of the package. One set of the LED chips 120 may be arranged for each light-emitting diode package, and in this case, a pair of the first and second lead frames and a pair of the first and second lead terminals may be arranged to correspond to the number of the LED chips. Various lead frames and various lead terminals may be arranged to correspond to requirement of the LED chips.

The LED package 100, as an example, includes a first package main body 130 configured to surround and fix a portion (ex. about half) of the circumference around the LED chips while exposing all the mounted LED chips 120 and a second package main body 140. Herein, depending on the need in application field and the arranged of the LED chips, the first package main body 130 may be provided on an arbitrary circumference other than the half of the circumference. In addition, the first and second package main bodies 130 and 140 include a first inclined side 135 and a second inclined side 145 on inside surfaces thereof.

In addition, as an example, the LED package 100 may include an envelope material 110 capable of protecting the LED chips 120 by enveloping the LED chips 120. Here, the envelope material 110 may be formed by using an enveloping resin, such as silicone. The envelope material 110 may include various fluorescent substances while efficiently emitting light emitted from the LED chips 120, and an exposed upper surface of the envelope material 110 may have various shapes in consideration of the beam angle. In addition, the envelope material 110 is formed in a space positioned between the first inclined side 135 of the first package main body 130 and the second inclined side 145 of the second package main body 140.

As shown in the sectional view of FIG. 2B, a height in a normal direction of the second package main body 140 is configured to be higher than a height in a normal direction of the first package main body 130, and the heights may be configured equally to each other according to circumstances. In addition, as shown in the front view of FIG. 2A, the first package main body 130 is arranged with a donut shape at a semi-circle around the LED chips, and on the other hand, the second package main body 140 is arranged to be closest to the LED chips 120 and provided to fill a whole remaining semi-circular area of a cup portion other than the portion in which the first package main body 130 is arranged. In other words, the shortest distance between the second inclined side 145 of the second package main body 140 and the LED chips 120 is smaller than the shortest distance between the first inclined side 135 and the LED chips. The second inclined side 145 may be configured to be approximately perpendicular to (including a state in which the second inclined side is arranged to be inclined within 5° or to be perpendicular to the normal line) a mounting space on which the LED chips 120 are mounted.

Among light beams emitted from the LED chips 120, light beams emitted toward the second inclined side 145 of the second package main body 140 are reflected on the second inclined side 145, thereby adjusting an emitted angle of the emitted light beams. Additionally, the second inclined side 145 and the first inclined side 135 may have a variety of known reflection films (not shown) consisting of polyphthalamide (PPA) in consideration of reflection property, luminance enhancement, and wavelengths of the emitted light beams. In order to efficiently dissipate heat generated from the LED chips, a reflection film may also be provided on an upper surface of the second package main body 140, and the reflection film formed on the upper surface of the second package main body 140 may be configured as various uneven surfaces so as to increase the surface area thereof.

The first and second package main bodies may be formed of the same material, and may be respectively formed of different materials when necessary. The first and second package main bodies may be formed of a material that is typically used in the technical field of a LED package, and as an example, the first and second package main bodies may be formed of plastic, such as PPA.

Figure 3A:
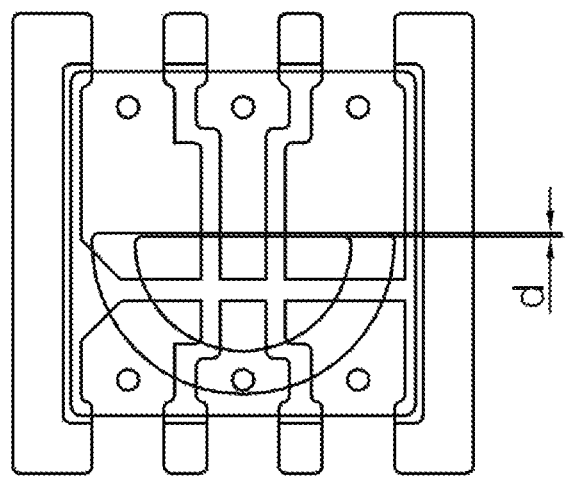
FIGS. 3A and 3B are a front view and a sectional view showing the surface mountable type light-emitting diode package having a controlled beam angle according to another embodiment of the present disclosure.
Figure 3B:
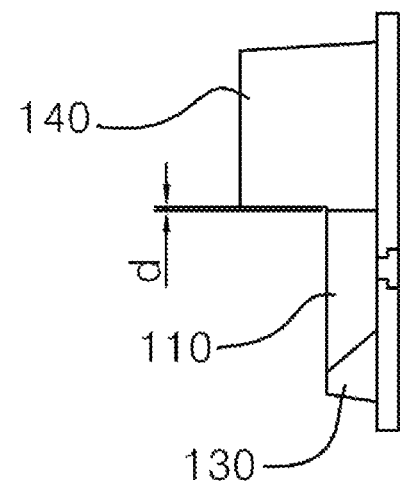

Herein, the envelope material 110 may be formed to be in directly contact with the second inclined side 145 of the second package main body 140, but as shown in FIG. 3, the envelope material 110 is preferably spaced apart from the second inclined side 145 at a predetermined distance by finding a point where the resin injected during formation of the envelope material 110 generates luminance deviation due to surface tension. It was confirmed experimentally that the spacing distance (d) is optimum at 0.05 mm or more. When the spacing distance (d) is smaller than 0.05 mm, the injected resin is formed to reach the upper surface of the second package main body 140 along the second inclined side 145, so it was confirmed that the light beams emitted from the LED chips 120 are deviated from an average beam angle to increase the non-uniformity of the beam angle and the luminance deviation.

On the basis of a normal direction of the LED chips 120, the height of an upper surface of the first package main body 130 is preferably equal to or higher than the height of the upper surface of the second package main body 140. As an example, the height of the upper surface of the first package main body 130 may be higher than the height of the upper surface of the second package main body 140 by about 1 mm or more.

Figure 4A:
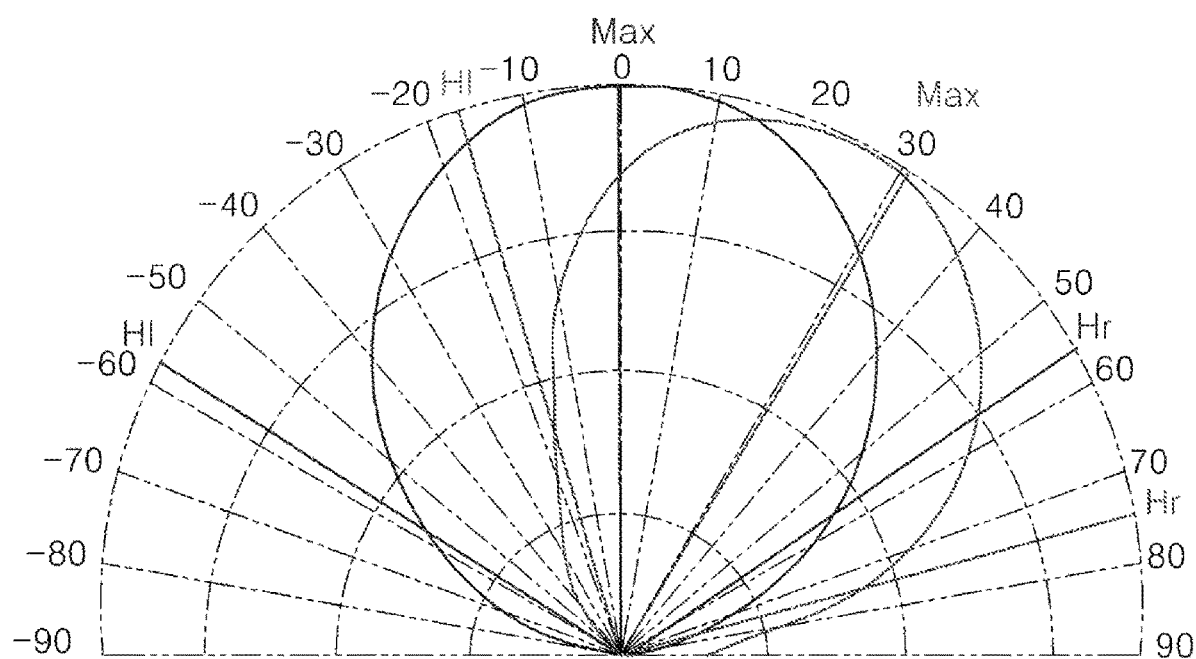
FIGS. 4A and 4B are graphs respectively showing beam angle measurement results in 3-axis directions with respect to the surface mountable type light-emitting diode package having a controlled beam angle according to the embodiment of the present disclosure and the surface mountable type light-emitting diode package according to the related art.
Figure 4B:
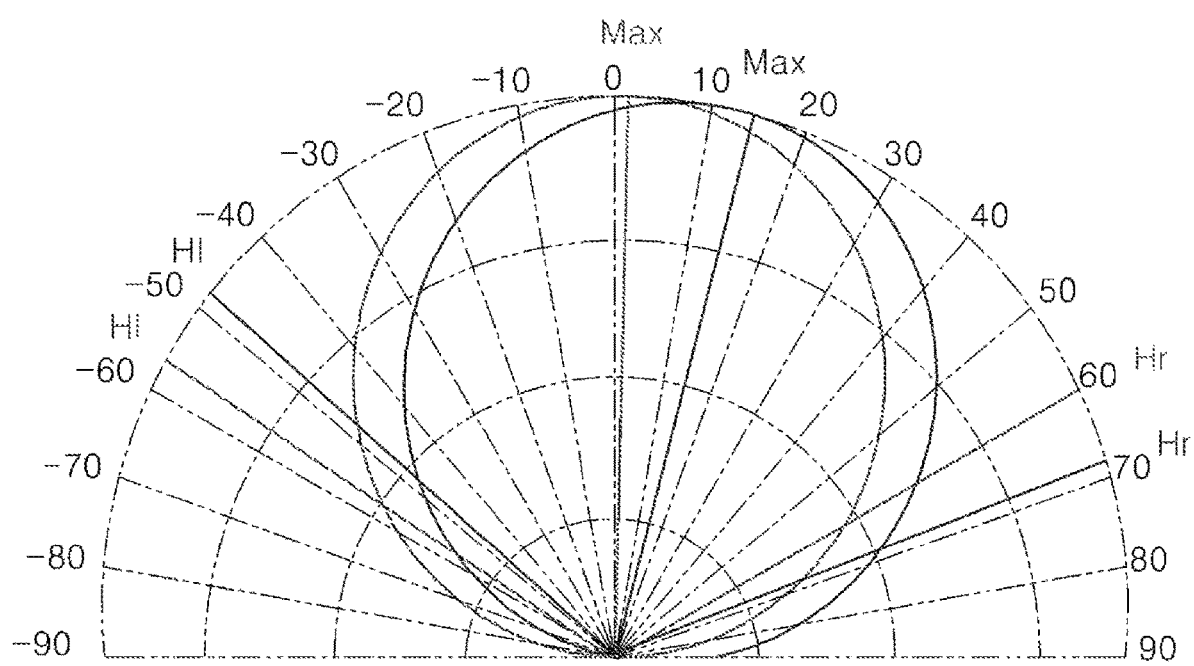

In FIGS. 4A and 4B, there are graphs respectively showing beam angle measurement results in 3-axis directions with respect to the surface mountable type LED package having a controlled beam angle according to the embodiment of the present disclosure and the surface mountable type LED package according to the related art. The 3-axis directions for measuring a beam angle corresponds to a portion of line A-A in FIG. 2A. As shown in FIG. 3, it was confirmed that the beam angle of the embodiment is controlled at a predetermined angle in comparison to the related art.

The surface mountable type LED package 100 with the controlled beam angle may be used in a light-emitting device, such as a variety of display device including an exterior electric sign. Furthermore, a plurality of LED packages according to the embodiment of the present disclosure is combined in the same direction (direction in which the second package main body is arranged at a relatively upper side compared to the first package main body on the basis of the ground so that the second package main body controls a beam angle) as FIG. 2A to constitute a module, and the module is arranged on a plane, thereby constituting the light-emitting device such as an electric sign.

Although the preferred embodiments of the present disclosure have been disclosed for illustrative purposes, those skilled in the art will appreciate that various modifications, additions and substitutions are possible, without departing from the scope and spirit of the invention as disclosed in the accompanying claims. The patent right of the present disclosure should be defined by the scope and spirit of the invention as disclosed in the accompanying claims.

The invention claimed is:

1. A light-emitting diode package having a controlled beam angle, the light-emitting diode package comprising:
   at least one first lead frame (102);
   at least one second lead frame (106) configured to correspond to and be spaced apart from the first lead frame;
   light-emitting diode chips (120) mounted on the first lead frame;
   a first package main body (130) which is fixed on partial surfaces of the first lead frame and the second lead frame and configured to have a first inclined side (135) at a portion of circumference around the light-emitting diode chips; and
   a second package main body (140) configured to have a second inclined side (145) at a remaining portion of the circumference around the light-emitting diode chips (120) other than the portion having the first inclined side,
   wherein a shortest distance between the second inclined side (145) of the second package main body (140) and the light-emitting diode chips (120) is smaller than a shortest distance between the first inclined side (135) and the light-emitting diode chips, and among light beams emitted from the light-emitting diode chips, light beams emitted towards the second inclined side (145) are reflected such that an emission angle of the emitted light beams is controlled, and the second package main body (140) has a spacing distance (d) spaced apart at a predetermined distance from an envelope material (110) configured to envelope the light-emitting diode chips.

2. The light-emitting diode package of claim 1, wherein the spacing distance (d) is higher than or equal to 0.05 mm.

3. The light-emitting diode package of claim 1, wherein, on the basis of a normal direction of the light-emitting diode chips, a height of an upper surface of the second package main body (140) is equal to or higher than a height of an upper surface of the first package main body.

4. The light-emitting diode package of claim 1, wherein the second inclined side (145) is configured to be perpendicular to a mounting surface of the light-emitting diode chips (120).

5. The light-emitting diode package of claim 1, wherein the second inclined side (145) comprises a reflection film so as to reflect the light beams emitted from the light-emitting diode chips.

6. The light-emitting diode package of claim 5, wherein the reflection film is configured to be extended to an upper surface of the second package main body (140), and the upper surface is configured as an uneven surface.

7. A light-emitting device configured to control a beam angle by using the light-emitting diode package having a controlled beam angle of claim 5.

* * * * *